United States Patent
Kim et al.

(10) Patent No.: US 6,288,926 B1
(45) Date of Patent: Sep. 11, 2001

(54) STATIC SEMICONDUCTOR MEMORY DEVICE AND FABRICATING METHOD THEREOF

(75) Inventors: Du-Eung Kim, Suwon; Byung-Gil Choi, Yongin; Sang-Jib Han; Choong-Keun Kwak, both of Suwon; Soon-Moon Jung, Sungnam; Sung-Bong Kim, Suwon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/535,871

(22) Filed: Mar. 27, 2000

(30) Foreign Application Priority Data

Mar. 26, 1999 (KR) .................................................. 99-10452

(51) Int. Cl.$^7$ ...................................................... G11C 5/06
(52) U.S. Cl. .............................................. 365/63; 365/51
(58) Field of Search ................................ 365/63, 51, 52, 365/57, 72

(56) References Cited

U.S. PATENT DOCUMENTS 5,293,559 * 3/1994 Kim et al. ............................. 365/63
5,325,336 * 6/1994 Tomishima et al. .................. 365/207
5,867,440 * 2/1999 Hidaka ................................. 365/226

* cited by examiner

Primary Examiner—Richard Elms
Assistant Examiner—Anh Phung
(74) Attorney, Agent, or Firm—Marger Johnson & McCollom, P.C.

(57) ABSTRACT

A semiconductor memory device is disclosed. The device is comprised of a plurality of word lines; a plurality of bit lines arranged in perpendicular to the word lines. In addition, a plurality of supply voltage lines extend in the same direction as the bit lines. Also, a plurality of first ground voltage lines are arranged in the same direction as the bit lines. Further, a plurality of second ground voltage lines are arranged in the same direction as the word lines. A plurality of memory cells are each connected between one of the word lines and one of the bit lines. Here, the ground voltage lines are arranged in a matrix shape to reduce the resistance of the ground voltage line and secure the margin between the supply voltage level and the ground voltage level of the data latched by the memory cells to thereby prevent an operational failure of the device.

5 Claims, 7 Drawing Sheets

STATIC SEMICONDUCTOR MEMORY DEVICE AND FABRICATING METHOD THEREOF

BACKGROUND OF THE INVENTION

1. Field of the Invention

The present invention relates to a static semiconductor memory device, and more particularly to a static semiconductor memory device which can prevent operational failure caused by increase of voltage at a ground voltage line at the time of high speed and low voltage operation.

2. Descriptions of the Prior Art

Memory cells of the static semiconductor memory device can be classified into a CMOS type comprising six transistors and a high-resistance loading type comprising two resistors and four transistors.

The high-resistance loading type memory cell is advantageous in reducing the chip area, but disadvantageous in increasing power consumption. The CMOS type memory cell is advantageous in reducing power consumption, but advantageous in increasing the chip area.

In a conventional static semiconductor memory device, the high-resistance loading type memory cell is used for constructing memory cell arrays to reduce the chip area.

However, since the static semiconductor memory device operates at high speed and at low voltage, the CMOS type memory cell is inevitably used to reduce power consumption.

A technique disclosed in U.S. Pat. No. 5,654,915 entitled "Six (6) Bulk Transistor Static Memory Cell Using Split Word line Architecture" discloses the layout of a CMOS type memory cell to reduce the chip area.

FIG. 1 illustrates the circuit and signal line arrangement of the CMOS type of memory cells disclosed in U.S. Pat. No. 5,654,915.

The CMOS type of memory cell is constructed with two (2) loading transistors P1, P2; two access transistors N1, N4; and two pulldown transistors N2, N3. The two loading transistors P1, P2 are vertically arranged in a rectangular shape. Also, the access transistors N1, N4 and two pulldown transistors N2, N3 are vertically arranged in a rectangular shape.

A split word line WL extends in a horizontal direction, and a supply voltage line VCC, a ground voltage line VSS and a pair of bit lines BL, BLB extends in a vertical direction.

The operation of the CMOS type of memory cells thus constructed will be described below.

A high-level signal is applied to a word line WL to turn on the two access transistors N1, N4. A high-level signal is applied to the bit line BL. A low level signal is applied to the inverted bit line BLB. The high and low level signals are transmitted to the drains of the two access transistors N1, N4. The loading transistor P1 and the pulldown transistor N3 turn on. The high and low level signals are further transmitted to the drains of the access transistors N1, N4. In other words, the signals transmitted through the access transistors N1, N4 are latched by cross-coupled transistors P1, P2 and pulldown transistors N2, N3. The complementary signals present on the bit lines BL, BLB thus are stored in the memory cell.

FIG. 2 illustrates the layout of the memory cell shown in FIG. 1, including an active area 10 constructed with loading transistors and another active area 12 constructed with access transistors and pulldown transistors. Furthermore, reference symbols P1d, P2d, N1d, N2d, N3d, N4d indicate drains of the transistors, reference symbols, P1s, P2s, N1s, N2s, N3s, N4s indicate sources of the transistors, and P1g, P2g, N1g, N2g, N3g, N4g indicate gates of the transistors.

Above mentioned U.S. Pat. No. 5,654,915 discloses the same layout of memory cell as shown in FIG. 2 to improve the structure of the conventional CMOS type of memory cell.

However, there is a problem in the CMOS type memory cell shown in FIG. 2. In detail, if the ground voltage line gets longer to increase its voltage, the margin between the supply voltage level and the ground voltage level decreases during low-voltage operation, thereby potentially causing operational failure in processing the data latched by the memory cell.

Accordingly, a need arises to correct such a problem in any static semiconductor memory device constructed with the conventional CMOS type memory cell as well as in the static semiconductor memory device constructed in the layout shown in FIGS. 1 and 2.

SUMMARY OF THE INVENTION

It is an object of the present invention to provide a static semiconductor memory device which can prevent an operational failure by securing a margin between supply voltage level and ground voltage level of the data latched at the memory cells in spite of high-resistance formed at the ground voltage line at the time of low voltage operations.

In order to accomplish the aforementioned object, a semiconductor memory device of the present invention is comprised of a plurality of word lines arranged in the horizontal direction; a plurality of bit lines arranged in perpendicular to the plurality of word lines; a plurality of supply voltage lines arranged in the same direction as the plurality of bit lines; a plurality of first ground voltage lines arranged in the same direction as the plurality of bit lines; a plurality of second ground voltage lines arranged in the same direction as the plurality of word lines; and the plurality of memory cells connected between the plurality of word lines and the plurality of bit lines.

In an alternative embodiment, a static semiconductor memory device of the present invention is comprised of: a plurality of word lines arranged in the horizontal direction; a plurality of pairs of bit lines each comprising a bit line and an inverted bit line and arranged in perpendicular to the plurality of word lines; a plurality of supply voltage lines arranged in the same direction as the plurality of bit lines; a plurality of first ground voltage lines arranged in the same direction as the plurality of bit lines; a plurality of second ground voltage lines arranged in the same direction as the plurality of word lines; and a plurality of static memory cells connected between the plurality of word lines and the plurality of pairs of bit lines. Here, the static memory cell is comprised of first and second access transistors respectively connected to a bit line and an inverted bit line of the pair of bit lines having a control electrode connected to one of the plurality of word lines. First loading and pulldown transistors are connected between the supply voltage lines and the first and second ground voltage lines to invert the signals transmitted from the first access transistor and, transmit the inverted signals to the second access transistor. Second loading and pulldown transistors are connected between the supply voltage lines and the first and second ground voltage lines to invert the signals transmitted from the second access transistor and, further, transmit the inverted signals to the first access transistor.

BRIEF DESCRIPTIONS OF THE DRAWINGS

FIG. 1 illustrates the structure of circuit and signal line array of a CMOS type of memory cell disclosed in U.S. Pat. No. 5,654,915;

DETAILED DESCRIPTIONS OF THE INVENTION

A conventional static semiconductor memory device will be described below with reference to accompanying drawings before descriptions of a static semiconductor memory device of the present invention.

Figure 1:
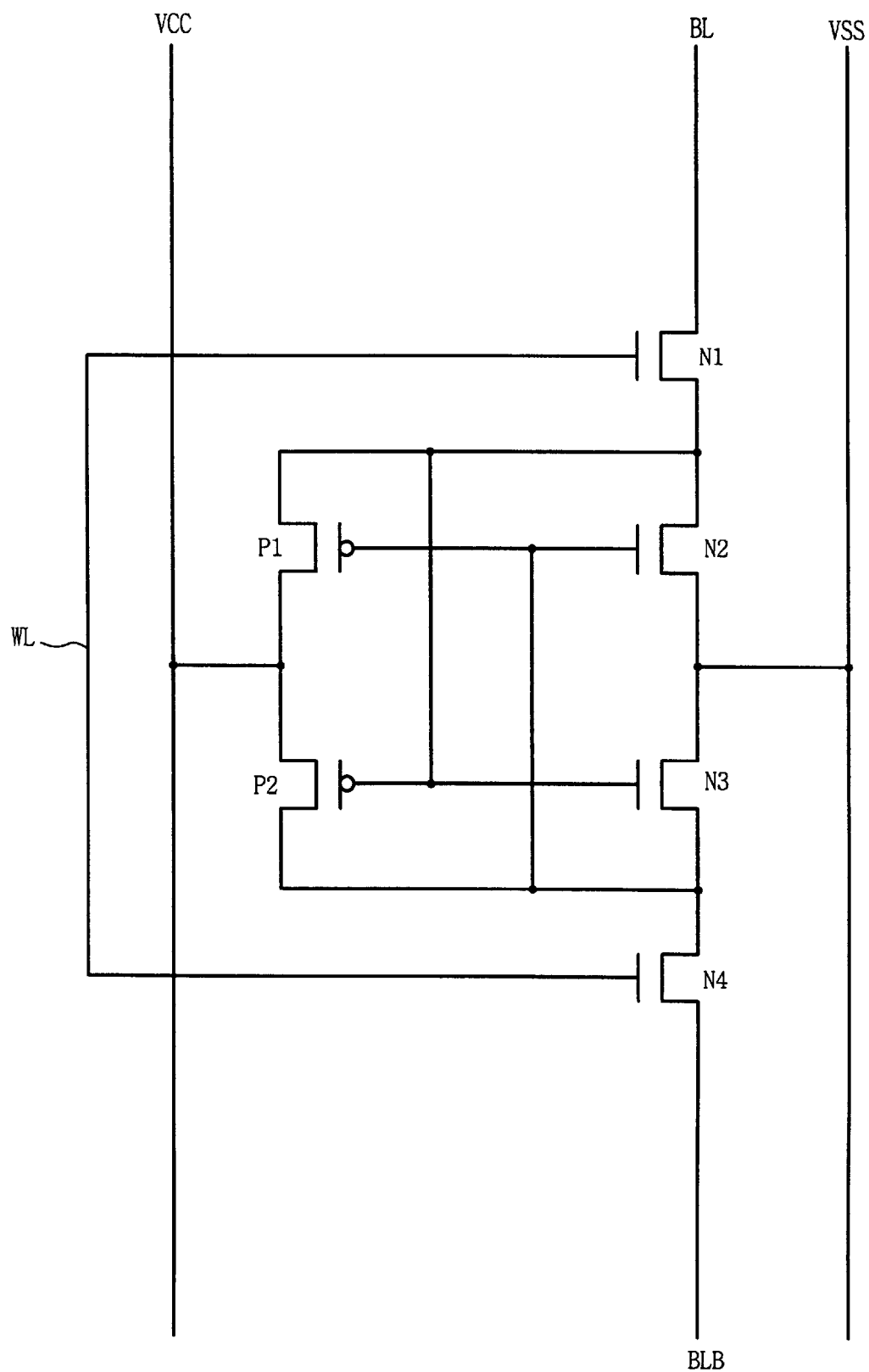
Figure 2:
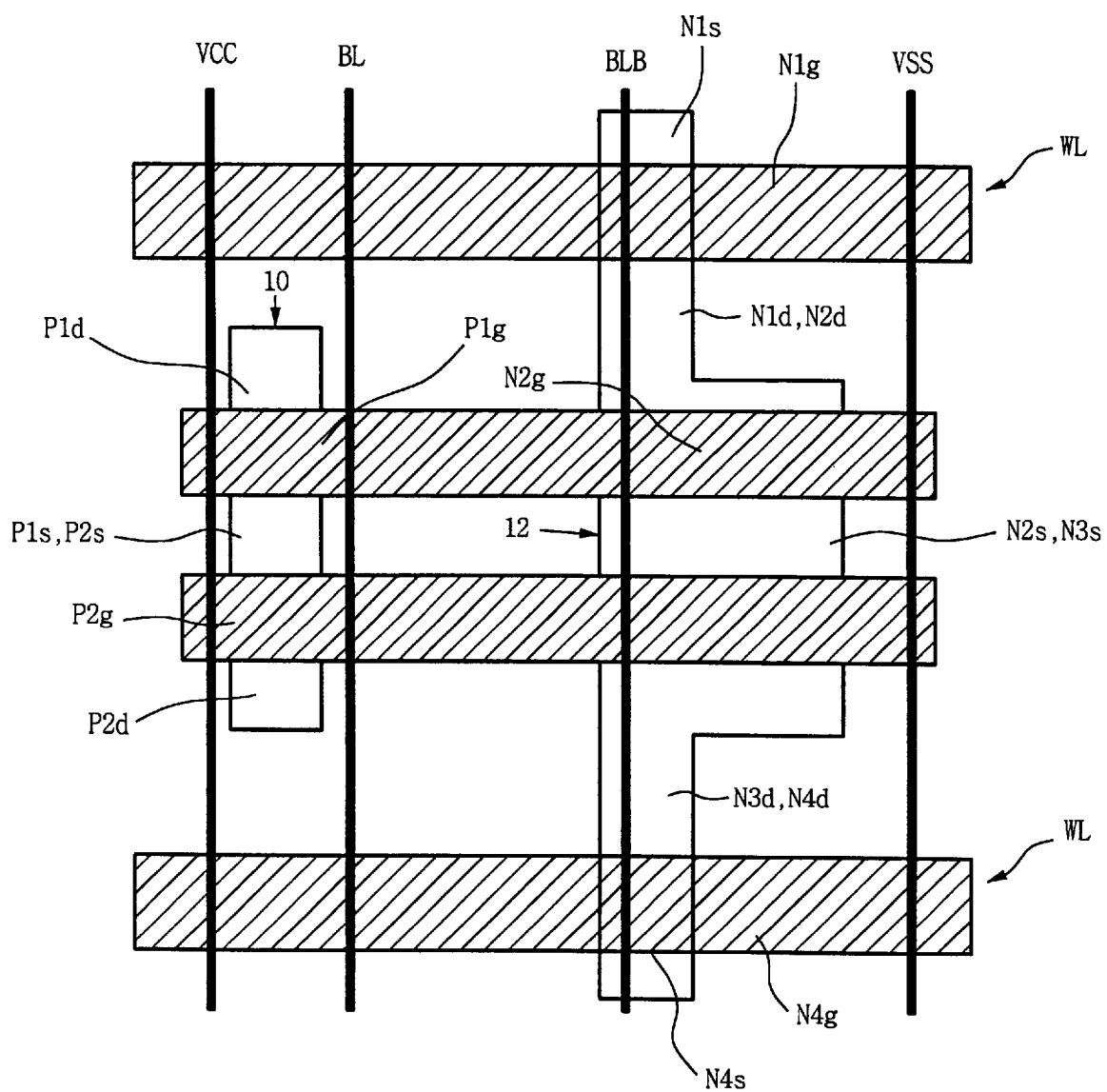
FIG. 2 illustrates the layout of the memory cell shown in FIG. 1.
Figure 3:
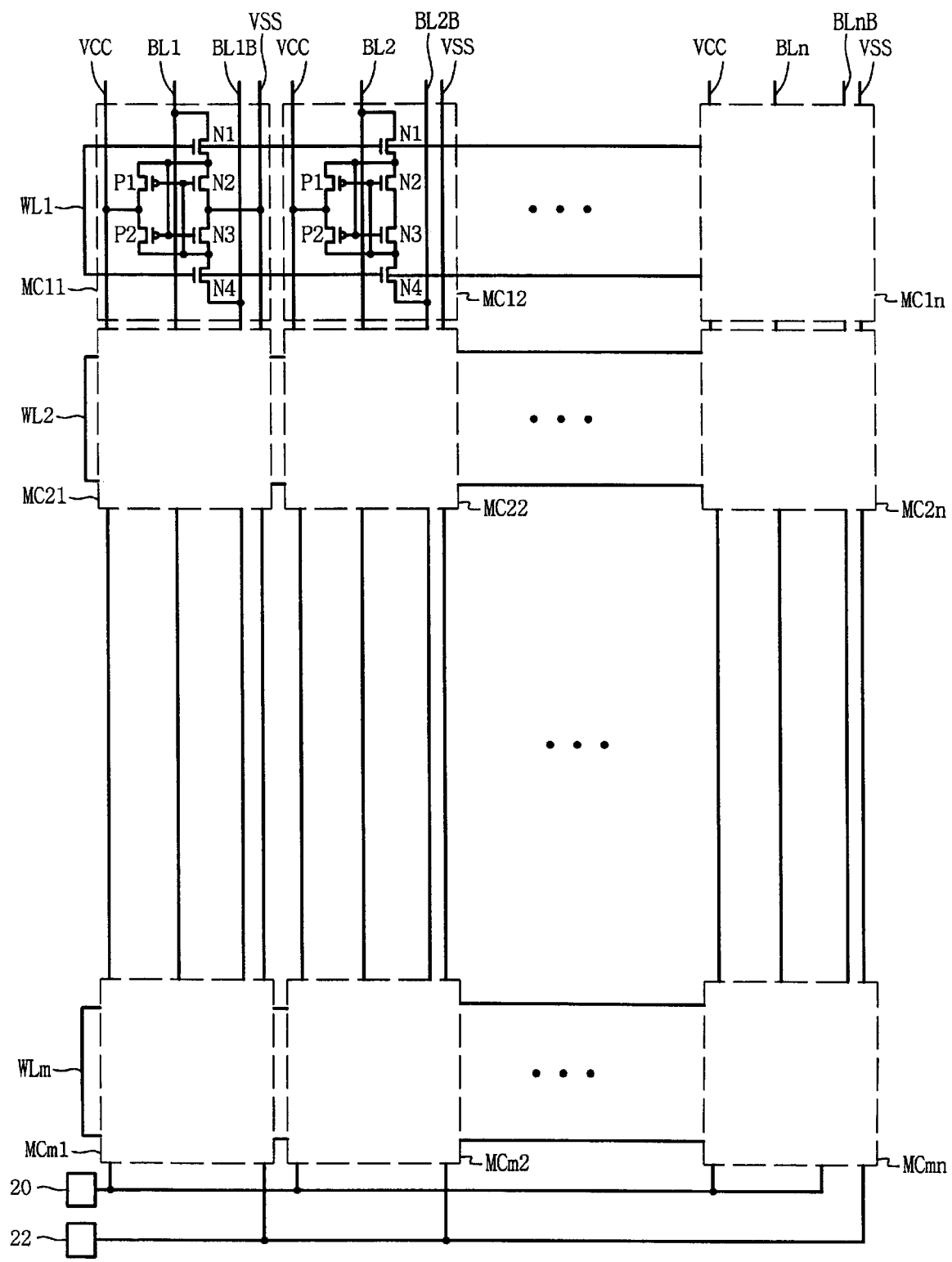
FIG. 3 illustrates the structure of a memory cell array of a static semiconductor memory device by using the CMOS type memory cell shown in FIG. 1.

FIG. 3 illustrates a memory cell array of the static semiconductor memory device constructed with plural, arrayed ones of the CMOS type memory cell shown in FIG. 1. The array comprises: nXm memory cells (MC11, MC12 ... MC1$n$, ..., MCm1, MCm2, ..., MCmn); m split word lines WL1, WL2, ..., WLm extending in a horizontal direction; pairs of bit lines (BL1, BLB1), ..., (BLn, BLnB) extending in a vertical direction; n supply voltage lines VCC, ground voltage lines VSS extending in a vertical direction; a supply voltage pad 20; and a ground voltage pad 22.

According to the layout of the memory cell array shown in FIG. 3, a pair of bit lines BL, BLB, supply voltage lines VCC and ground voltage lines VSS extend perpendicular to the word lines.

There is a problem in the memory cell arrays arranged as shown in FIG. 3. As the ground voltage lines VSS get longer, the voltage of the ground voltage line VSS increases to thereby reduce the margin between the supply voltage level and the ground voltage level during low voltage operation, thereby causing an operational failure in processing the data latched at the memory cells.

For instance, if a high level of voltage is transmitted to a pair of bit lines BL, BLB is 3V. If a low-level voltage is 0V, the 3V and 0V signals are respectively transmitted to the drains of NMOS transistors N1, N4 of the memory cells. Then, 3V and 0V signals are latched by the two loading transistors P1, P2 and two pulldown transistors N2, N3 of the memory cells. However, when 0V signal is latched by the pulldown transistors, it may not definitely drop to 0V due to high voltage of the ground voltage line VSS. In other words, even if the memory cells latch 0V and 3V signals, they latch voltage levels of signals, higher than 0V. Therefore, the margin between the supply voltage level and the ground voltage level may not be sufficiently secured, thereby causing an operational failure in processing the data latched at the memory cells in the cell array.

As the ground voltage line of the semiconductor memory device gets longer, resistance of the ground voltage line gets higher. As a result, electric potential of the ground voltage level is increased. As the semiconductor memory device is constructed to operate at low voltage, the margin between the supply voltage level and the ground voltage level gets smaller. Therefore, the probability of the operational failure occurring in the semiconductor memory device increases.

Therefore, in order to reduce the increased resistance of the ground voltage line resulting from the increasing length of the ground voltage line, the ground voltage lines are arranged in a matrix shape in the semiconductor memory device of the present invention.

Figure 4:
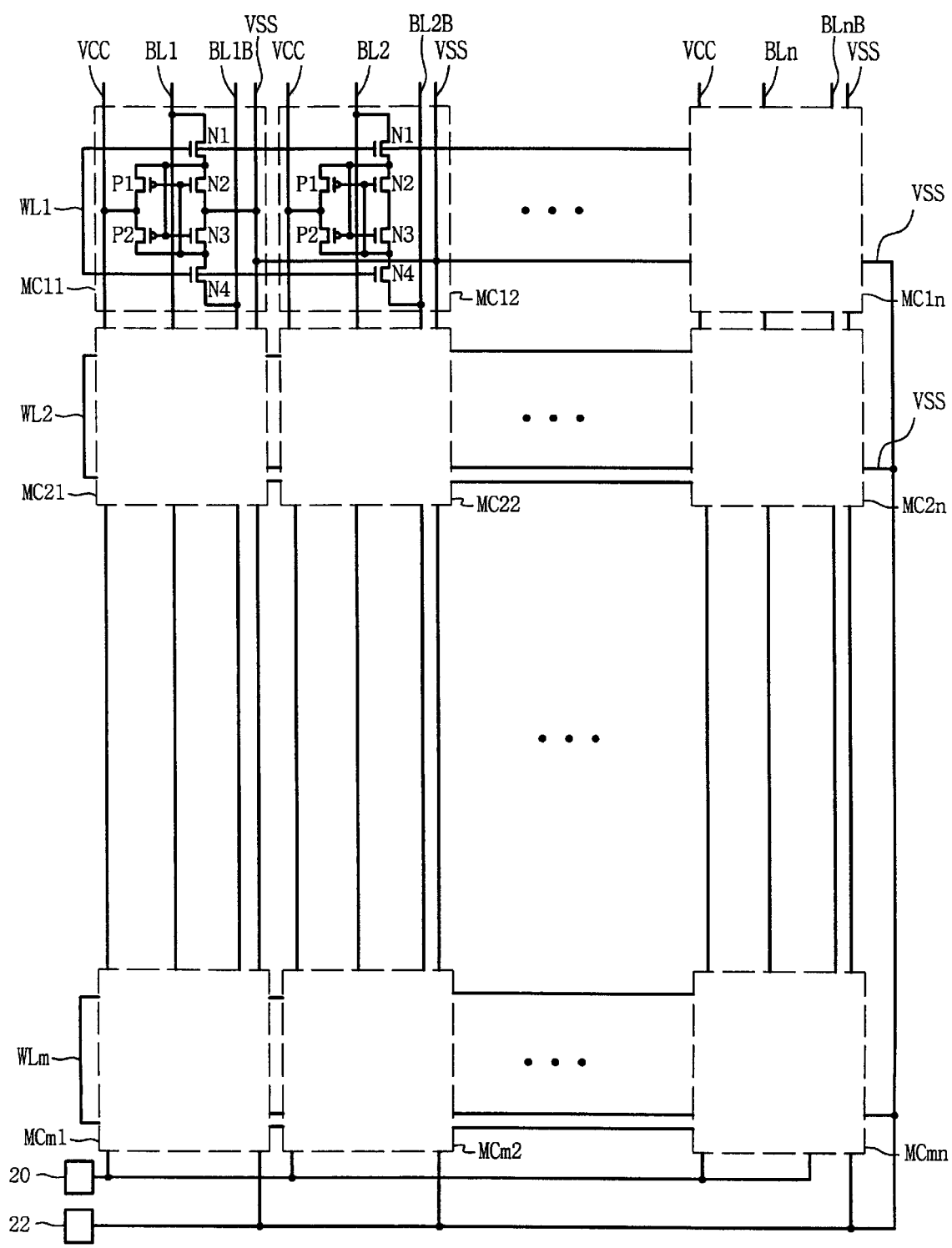
FIG. 4 illustrates a first embodiment of memory cell array of a static semiconductor memory device of the present invention.

FIG. 4 illustrates a first embodiment of memory cell arrays of a static semiconductor memory device of the present invention. In the memory cell arrays of the static semiconductor memory device shown in FIG. 3, the ground voltage lines VSS are additionally arranged along with the horizontally positioned memory cells.

The memory cell array of the static semiconductor memory device of the present invention shown in FIG. 4 is constructed with the ground voltage lines arranged in a matrix shape by the unit of a memory cell and being provided for each row of memory cells in the array.

If the ground voltage lines VSS are arranged in a matrix shape, the resistance of the ground voltage line is reduced, preventing the operational failure in processing the data latched at the memory cells during low-voltage operation.

Furthermore, the ground voltage lines preferably are arranged in a horizontal direction after pairs of bit lines, supply voltage lines and vertical ground voltage lines are laid out.

Figure 5:
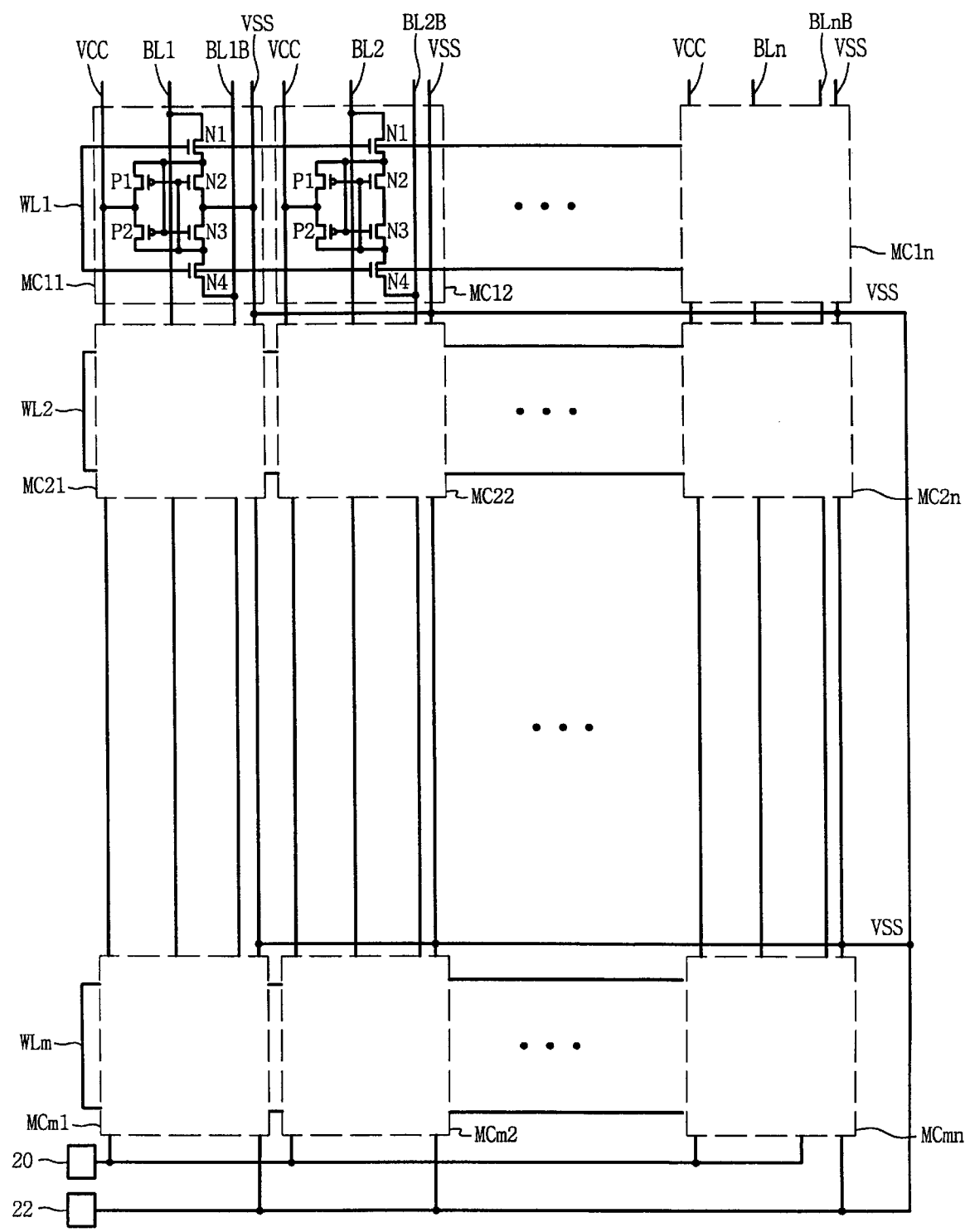
FIG. 5 illustrates a second embodiment of memory cell array of a static semiconductor memory device of the present invention.

FIG. 5 illustrates a second embodiment of the memory cell array of the static semiconductor memory device of the present invention. The horizontal ground voltage lines VSS are additionally arranged to interconnect the ground voltage lines by coupling adjacent rows of the memory cell array shown in FIG. 3. Thus, in accordance with the present invention, memory cells within the array are coupled by the VSS ground lines along both axes of the array.

Even if the ground voltage lines in FIG. 5 are also arranged in a matrix shape, the number of the ground voltage lines positioned in a horizontal direction may be reduced. In this case, the resistance of the ground voltage lines reduces as in the embodiment shown in FIG. 4, thereby preventing reduction in the margin between the supply voltage level and ground voltage level of the data to be latched in the memory cells.

Figure 6:
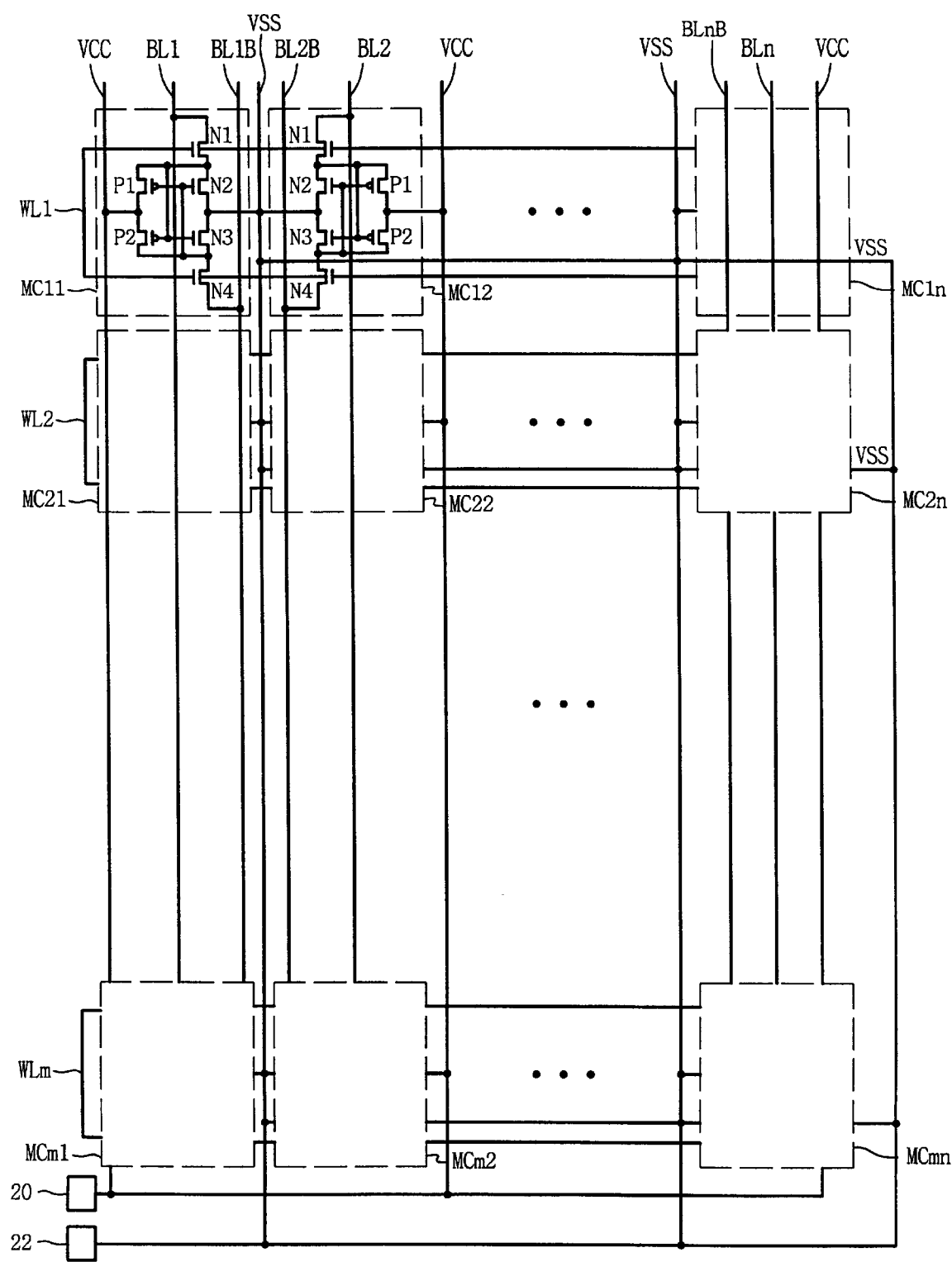
FIG. 6 illustrates a third embodiment of memory cell array of a static semiconductor memory device of the present invention.

FIG. 6 illustrates a third embodiment of the memory cell array of the static semiconductor memory device of the present invention, which comprises the transistors and signal lines of horizontally neighboring memory cells symmetrically arranged to each other; supply voltage lines VCC and ground voltage lines VSS commonly shared by neighboring memory cells; and ground voltage lines VSS horizontally arranged to connect the ground voltage lines of horizontally positioned memory cells.

The ground voltage lines VSS in FIG. 6 are also arranged in a matrix shape, thereby reducing resistance thereof. Therefore, the margin can be secured between the supply voltage level and the ground voltage level of the data latched at the memory cells.

Figure 7:
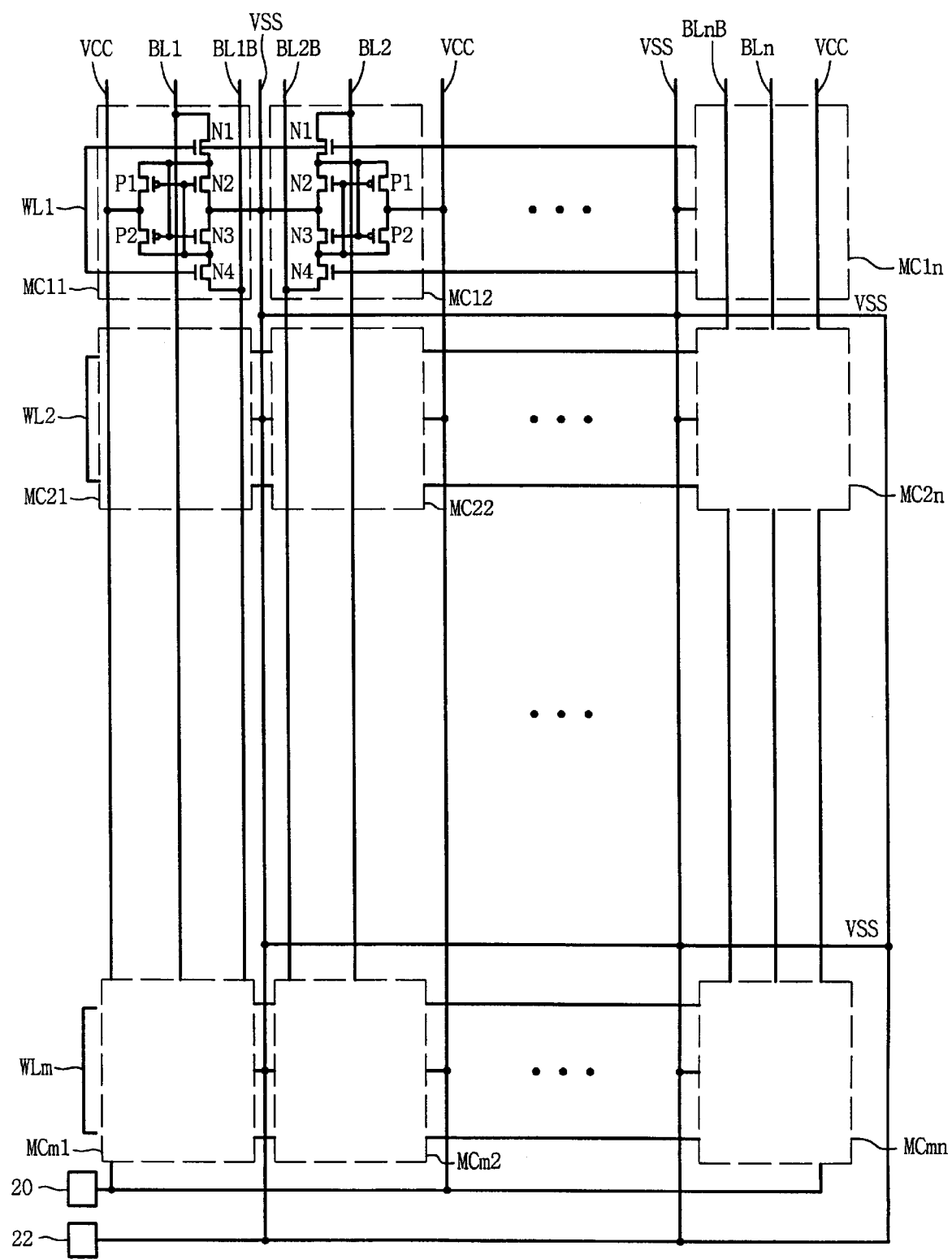
FIG. 7 illustrates a fourth embodiment of memory cell array of a static semiconductor memory device of the present invention.

FIG. 7 illustrates a fourth embodiment of the memory cell array of the static semiconductor memory device of the present invention. The ground voltage lines VSS horizontally positioned at the memory cell arrays shown in FIG. 6 are constructed not by the unit of a horizontally arranged single line, or a row of memory cells, but by the unit of one or more, e.g., two. Those of skill in the art will appreciate that the horizontally arranged lines of memory cells. The unit can be one, two, . . . N adjacent rows of memory cells (wherein N is positive integer). N may be understood to represent a ratio between the number of rows and the number of ground lines (VSS) The memory cell arrays are arranged as shown in FIG. 7, thereby reducing the number of ground voltage lines in a matrix shape and the resistance of the ground voltage lines at the same time.

In the embodiments shown in FIGS. 5 through 7, the ground voltage lines to be arranged in a horizontal direction should be positioned after the arrangement of the memory cells and other signal lines, as in FIG. 4.

In other words, ground voltage lines are arranged in a matrix shape in the memory cell arrays of the static semiconductor memory device of the present invention, thereby decreasing the resistance of the ground voltage lines that may increase with longer ground voltage lines.

Therefore, there are advantages in the static semiconductor memory device of the present invention in that the resistance of the ground voltage lines VSS is lowered during low voltage operation, thereby securing the margin between the supply voltage level and the ground voltage level of the data latched in the memory cells.

Even if the ground voltage lines positioned in a horizontal direction are arranged by the unit of one or two lines of the horizontally arranged memory cells in the embodiments described above, the ground voltage lines can also be arranged by the unit of more than three lines of the memory cells.

In addition, even if the aforementioned embodiments are described with the ground voltage lines to be arranged in a matrix shape in the memory cell array of the static semiconductor memory device comprising CMOS type memory cells, the scope of the present invention is not restricted to the embodiments described above, but covers all the applications for arranging the ground voltage lines of the memory cell arrays of a variety of types of the semiconductor memory device which operates at high speed and low voltage.

Therefore, there are advantages in the static semiconductor memory device of the present invention in that the ground voltage lines are arranged in a matrix shape to reduce the resistance of the ground voltage line and secure the margin between the supply voltage level and the ground voltage level of the data latched in the memory cells to thereby prevent an operational failure of the device.

Also, there is another advantage in the static semiconductor memory device in that the ground voltage lines of the memory cell array are arranged in a matrix shape to thereby improve reliability of the device.

What is claimed is:

1. A semiconductor memory device having an array comprising:

a plurality of word lines extending through the array;

a plurality of bit lines extending through the array perpendicularly to the plurality of word lines;

a plurality of supply voltage lines extending through the array in a direction parallel to the plurality of bit lines;

a plurality of first ground voltage lines extending through the array in a direction parallel to the plurality of bit lines;

a plurality of second ground voltage lines extending through the array in a direction parallel to the plurality of word lines; and a plurality of memory cells each connected between one of the plurality of word lines and one of the plurality of bit lines.

2. The device, as defined in claim 1, wherein the plurality of the first ground voltage lines extends along the unit of the plurality of memory cells positioned in a direction parallel to the plurality of bit lines.

3. The device, as defined in claim 1, wherein the plurality of the second ground voltage lines are arranged by the unit (N) of a predetermined number of lines of the plurality of memory cells positioned in the same direction as the plurality of word lines, wherein N is a positive integer.

4. The device, as defined in claim 1, wherein the plurality of the second ground voltage lines are positioned after the arrangement of the plurality of memory cells, the plurality of word lines, the plurality of bit lines, the plurality of supply voltage lines and the plurality of the first ground voltage lines.

5. A method of designing a semiconductor memory device comprising the steps of:

arranging a plurality of memory cells in a matrix shape in an array on a semiconductor substrate;

arranging a plurality of word lines extending through the array across the plurality of memory cells, arranging a plurality of bit lines through the array perpendicularly to the plurality of word lines, arranging a plurality of supply voltage lines and a plurality of first ground voltage lines through the array in perpendicular to the plurality of word lines; and arranging a plurality of second ground voltage lines through the array in a direction parallel to the plurality of word lines.

* * * * *